(12) United States Patent
Xin

(10) Patent No.: US 6,214,704 B1
(45) Date of Patent: Apr. 10, 2001

(54) METHOD OF PROCESSING SEMICONDUCTOR WAFERS TO BUILD IN BACK SURFACE DAMAGE

(75) Inventor: Yun-Biao Xin, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/404,428

(22) Filed: Sep. 23, 1999

Related U.S. Application Data
(60) Provisional application No. 60/112,438, filed on Dec. 16, 1998.

(51) Int. Cl.$^7$ ............... H01L 21/326; H01L 21/302
(52) U.S. Cl. ............... 438/471; 438/690; 438/692; 438/745; 438/753
(58) Field of Search ............... 438/745, 974, 438/691, 747, 753, 906, 690, 928, 692, 471

(56) References Cited

U.S. PATENT DOCUMENTS

| | | | |
|---|---|---|---|
| 3,979,239 | 9/1976 | Walsh | 156/4 |
| 4,144,099 | 3/1979 | Edmonds et al. | 148/1.5 |
| 4,276,114 | 6/1981 | Takano et al. | 156/645 |
| 4,318,250 | 3/1982 | Klievoneit et al. | 51/134 |
| 4,663,890 | 5/1987 | Brandt | 51/283 R |
| 4,693,036 | 9/1987 | Mori | 51/131.3 |
| 4,753,049 | 6/1988 | Mori | 51/131.3 |
| 4,947,598 | 8/1990 | Sekiya | 51/283 R |
| 4,971,920 | 11/1990 | Miyashita et al. | 437/10 |
| 4,980,300 | 12/1990 | Miyashita et al. | 437/10 |
| 5,035,087 | 7/1991 | Nishiguchi et al. | 51/131.1 |
| 5,071,776 | 12/1991 | Matsushita et al. | 437/10 |
| 5,110,428 | 5/1992 | Prigge et al. | 204/129.3 |
| 5,113,622 | 5/1992 | Nishiguchi et al. | 51/165.73 |

(List continued on next page.)

FOREIGN PATENT DOCUMENTS

| | | | |
|---|---|---|---|
| 0 460 437 A2 | 12/1991 | (EP) | H01L/21/304 |
| 0 460 437 A3 | 12/1991 | (EP) | H01L/21/304 |
| 0 588 055 A2 | 3/1994 | (EP) | H01L/21/304 |
| 0 617 456 A2 | 9/1994 | (EP) | H01L/21/20 |
| 0 617 456 A3 | 9/1994 | (EP) | H01L/21/20 |
| 0 628 992 A2 | 12/1994 | (EP) | H01L/21/306 |
| 0 699 504 A1 | 3/1996 | (EP) | B24B/37/04 |
| 0 755 751 A1 | 1/1997 | (EP) | B23B/7/17 |
| 0 782 179 A2 | 7/1997 | (EP) | H01L/21/304 |
| 0 782 179 A3 | 7/1997 | (EP) | H01L/21/304 |
| 0 791 953 A2 | 8/1997 | (EP) | H01L/21/302 |
| 0 798 405 A2 | 10/1997 | (EP) | C30B/33/00 |
| 0 617 457 B1 | 5/1998 | (EP) | H01L/21/302 |
| 0 850 737 A2 | 7/1998 | (EP) | B28D/5/00 |
| 63-081934 | 4/1988 | (JP) | . |
| 02299232 | 11/1990 | (JP) | . |
| 8-274050 | 10/1996 | (JP) | H01L/21/304 |

(List continued on next page.)

OTHER PUBLICATIONS

PCT Notification of Transmittal of the International Search Report or the Declaration, mailed Mar. 20, 2000.

Primary Examiner—Richard Elms
Assistant Examiner—Michael S. Lebentritt
(74) Attorney, Agent, or Firm—Senniger, Powers, Leavitt & Roedel

(57) ABSTRACT

A method of processing a semiconductor wafer sliced from a single-crystal ingot includes lapping front and back surfaces of the wafer to reduce the thickness of the wafer and to improve the flatness of the wafer. The front surface is subjected to fine grinding to reduce the damage on the front surface while leaving damage on the back surface intact. The front and back surfaces are simultaneously polished to improve the flatness of the wafer and to reduce wafer damage on the front and back surfaces. The wafer damage remaining on the back surface is greater than the wafer damage on the front surface. The wafer damage remaining on the back surface facilitates gettering.

15 Claims, 2 Drawing Sheets

U.S. PATENT DOCUMENTS

| | | | |
|---|---|---|---|
| 5,189,843 | 3/1993 | Steere, Jr. ............................ | 51/165.76 |
| 5,227,339 | 7/1993 | Kishii ................................... | 437/225 |
| 5,329,733 | 7/1994 | Steere, Jr. ............................ | 51/165.76 |
| 5,360,509 * | 11/1994 | Zakaluk et al. ....................... | 148/645 |
| 5,364,655 | 11/1994 | Nakamura et al. ................... | 427/129 |
| 5,377,451 | 1/1995 | Leoni et al. .......................... | 451/287 |
| 5,389,579 | 2/1995 | Wells .................................... | 437/225 |
| 5,429,711 | 7/1995 | Watanabe et al. ..................... | 216/52 |
| 5,447,890 | 9/1995 | Kato et al. ............................ | 437/249 |
| 5,516,706 | 5/1996 | Kusakabe .............................. | 437/12 |
| 5,545,076 | 8/1996 | Yun et al. ............................. | 451/287 |
| 5,571,373 | 11/1996 | Krishna et al. ..................... | 156/636.1 |
| 5,679,060 | 10/1997 | Leonard et al. ....................... | 451/43 |
| 5,679,212 | 10/1997 | Kato et al. ......................... | 156/636.1 |
| 5,697,832 | 12/1997 | Greenlaw et al. ..................... | 451/291 |
| 5,705,423 * | 1/1998 | Sakata et al. ......................... | 437/81 |
| 5,800,725 | 9/1998 | Kato et al. ............................. | 216/88 |
| 5,821,166 | 10/1998 | Hajime et al. ........................ | 438/691 |
| 5,821,167 | 10/1998 | Fukami et al. ........................ | 438/691 |
| 5,827,779 | 10/1998 | Masumura et al. ................... | 438/691 |
| 5,849,603 | 12/1998 | Kato et al. ............................. | 438/14 |
| 5,849,636 | 12/1998 | Harada et al. ........................ | 438/691 |
| 5,851,924 | 12/1998 | Nakazawa et al. ................... | 438/691 |
| 5,866,226 | 2/1999 | Masumura et al. ................... | 428/64.1 |
| 5,873,772 | 2/1999 | Hajime et al. ......................... | 451/41 |
| 5,963,821 | 10/1999 | Kai et al. .............................. | 438/460 |
| 6,117,231 * | 9/2000 | Fusegawa et al. ..................... | 117/30 |

FOREIGN PATENT DOCUMENTS

| | | | |
|---|---|---|---|
| 08316180 | 11/1996 | (JP) . | |
| 9-103944 | 4/1997 | (JP) ............................. | H01L/21/304 |
| 9-270400 | 10/1997 | (JP) . | |
| 6-312274 | 12/1997 | (JP) . | |
| 10135164 | 5/1998 | (JP) . | |
| 97008392 | 2/1997 | (KR) . | |

* cited by examiner

METHOD OF PROCESSING SEMICONDUCTOR WAFERS TO BUILD IN BACK SURFACE DAMAGE

CROSS-REFERENCE TO RELATED APPLICATION

This application claims priority from U.S. Provisional Patent application No. 60/112,438, filed Dec. 16, 1998.

BACKGROUND OF THE INVENTION

The present invention relates generally to a method of processing semiconductor wafers, and, more particularly, to a method of processing semiconductor wafers for producing relatively flat wafers having back surface damage for external gettering.

Semiconductor wafers are generally prepared from a single crystal ingot, such as a silicon ingot, which is trimmed and ground to have one or more flats for proper orientation of the wafer in subsequent procedures. The ingot is then sliced into individual wafers which are each subjected to a number of processing operations to reduce the thickness of the wafer, remove damage caused by the slicing operation, and to create a highly reflective surface. Typically, the peripheral edge of each wafer is rounded to reduce the risk of wafer damage during further processing. A lapping operation (an abrasive slurry process) is then performed on the front and back surfaces of the wafer to reduce the thickness of the wafer and remove damage induced by the slicing operation. A chemical etching operation or a rough grinding operation may also be performed to reduce the thickness and remove damage.

Upon completion of the lapping operation, one or both surfaces of each wafer are usually polished using a polishing pad, a colloidal silica slurry (polishing slurry) and a chemical etchant to remove damage to the surfaces induced by prior operations and to ensure that the wafer is planar. Thereafter, it is often desirable to induce damage on the back surface of each wafer to provide external gettering sites. Conventionally, the back surface of each wafer is subjected to an abrasive process, such as pressure jetting, or a polysilicon deposition process to induce damage on the back surface for external gettering sites. The front surface of the wafer must be protected while the damage is induced on the back surface. The wafers are then cleaned and the front surface may be finish polished. Finally, the wafers are inspected prior to delivery to the customer for dicing the wafer into semiconductor chips.

The finished wafers must meet certain surface flatness requirements. Such wafers must be polished particularly flat in order to print circuits on them (or on layers deposited upon them) by, for example, an electron beam-lithographic or photolithographic process. Wafer flatness in the focal point of the electron beam delineator or optical printer is important for uniform imaging in the electron beam-lithographic and photolithographic processes. The flatness of the wafer surface directly impacts device line width capability, process latitude, yield and throughput. The continuing reduction in device geometry and increasingly stringent device fabrication specifications are forcing manufacturers of semiconductor wafers to prepare flatter wafers. To achieve flatter wafers, double surface polishing has become the process of choice.

However, flatness is negatively impacted by conventional methods for creating back side damage to facilitate gettering. The conventional method of processing a semiconductor wafer requires a process after double surface polishing in order to induce damage to provide gettering sites on the back surface of the wafer. After this gettering process, an additional polishing process on the front surface of the wafer is required to remove the processed damage. This additional process can severely degrade the wafer flatness. The additional step is costly in that processing and handling are increased, and it requires that special precautions be taken to protect the front surface from damage.

SUMMARY OF THE INVENTION

Among the several objects of this invention may be noted the provision of a method for processing a semiconductor wafer sliced from a single-crystal ingot that reduces the processing required for shaping each wafer; the provision of such a process which produces a relatively flat wafer; the provision of such a process which produces a wafer having gettering sites; and the provision of such a process which is economical for use in processing wafers.

Generally, a method of the present invention for processing a semiconductor wafer sliced from a single-crystal ingot and having front and back surfaces and a peripheral edge comprises lapping the front and back surfaces of the wafer to reduce the thickness of the wafer and to improve the flatness of the wafer. The lapping step creates damage on the front and back surfaces. The method further comprises fine grinding the front surface of the wafer to reduce the damage on the front surface caused by the lapping and to further reduce the thickness of the wafer. During the fine grinding step, the damage on the back surface is left intact. The front and back surfaces of the wafer are simultaneously polished using a polishing slurry to improve the flatness of the wafer and to reduce wafer damage on the front and back surfaces. The wafer damage remaining on the back surface after polishing is greater than the wafer damage on the front surface. The wafer damage remaining on the back surface facilitates gettering.

In another aspect of the invention, a method of processing the semiconductor wafer comprises lapping the front and back surfaces of the wafer to reduce the thickness of the wafer and to improve the flatness of the wafer. The lapping step creates damage on the front and back surfaces. The method further comprises simultaneously polishing the front and back surfaces of the wafer such that less wafer material is removed from the back surface than the front surface. The wafer damage remaining on the back surface is greater than the wafer damage on the front surface. The wafer damage remaining on the back surface facilitates gettering.

Other objects and advantages of the invention will be apparent from the following detailed description.

DETAILED DESCRIPTION OF THE PREFERRED EMBODIMENTS

Figure 1:
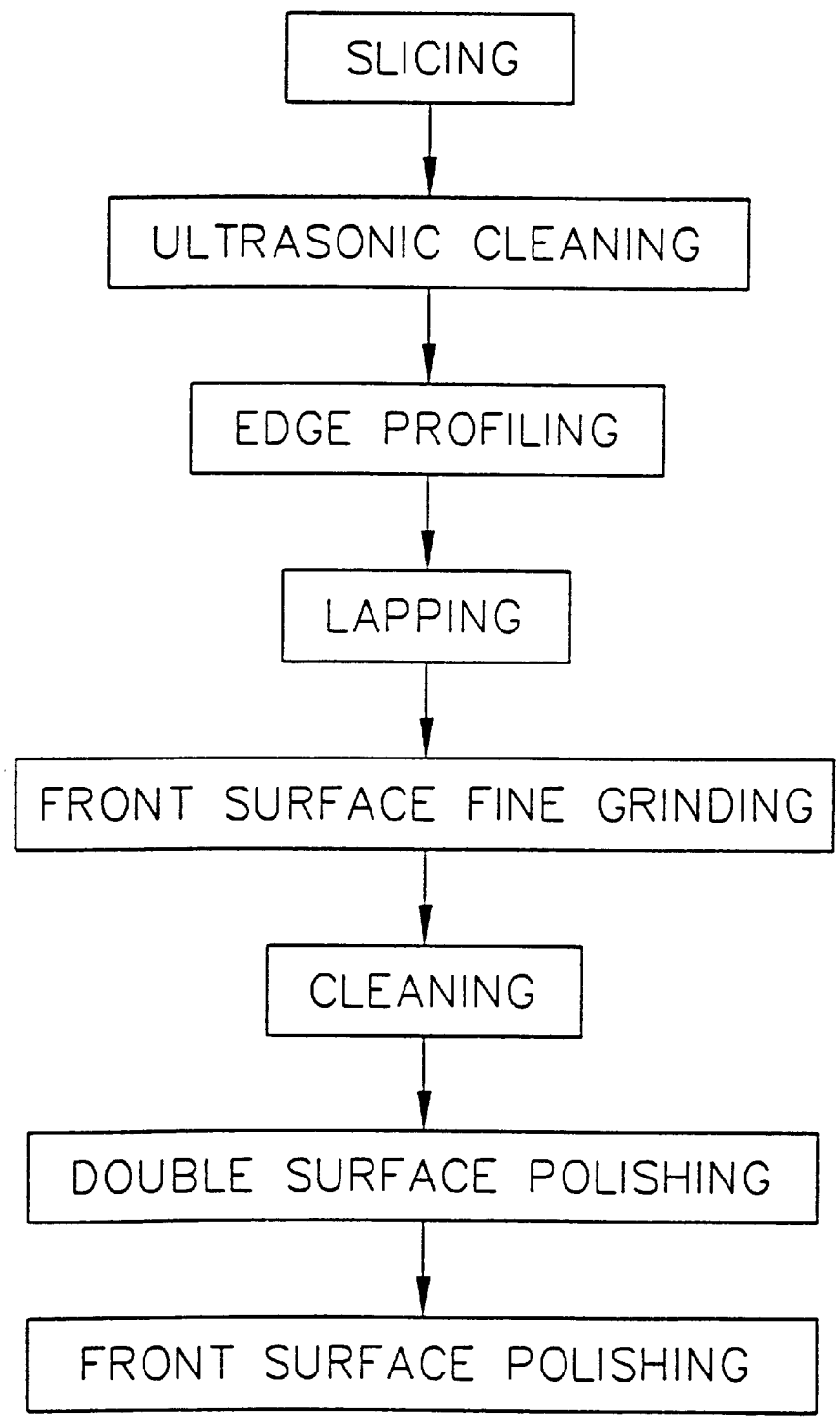
FIG. 1 is a flow diagram of a method of a first embodiment of the present invention for processing a semiconductor wafer.

FIG. 1 illustrates a preferred method of processing a semiconductor wafer in which a fine grinding operation is performed on the front surface before a double surface polishing operation. This method produces a wafer having back surface damage for gettering sites, but does not require a back surface processing step in order to induce back surface damage to provide gettering sites. In other words, no step is performed on the back surface that is not also performed on the front surface.

The semiconductor wafer is sliced from a single-crystal ingot, such as by using a conventional inner diameter saw or conventional wire saw, to have a predetermined initial thickness. The sliced wafer is generally disk-shaped and convex, and has a peripheral edge and opposing front and back surfaces. For purposes of this description, the front surface is the surface upon which devices are ultimately printed. The initial thickness of each wafer is substantially greater than the desired final thickness to allow subsequent processing operations to reduce the thickness of the wafer without the risk of damaging or fracturing the wafer. As an example, the initial thickness may be in the range of about 800–950 microns, while final thickness is about 700–750 microns.

After slicing, the wafer is subjected to ultrasonic cleaning to remove abrasive particles and debris deposited on the wafer from the slicing operation. The peripheral edge of the wafer is profiled (e.g., rounded) by a conventional edge grinder (not shown) to reduce the risk of chipping or fracture of the wafer edge during further processing.

The wafer is then placed in a conventional lapping apparatus (not shown) for lapping the front and back surfaces to reduce the thickness of the wafer and to improve the flatness of the wafer. Reduction of the thickness via the lapping operation also removes damage caused by the wafer slicing operation. The lapping step, however, creates damage (signature damage) on the front and back surfaces that has different characteristics than the damage caused by the wafer slicing operation. Suitable lapping apparatus include Peter Wolters Model Nos. AC1400 and AC2000, manufactured by Peter Wolters Corporation, Plainville, Mass. The lapping apparatus preferably employs a slurry including an abrasive, such as alumina or silicon carbide, having grains sized between 5 and 30 microns, and preferably about 15 microns. The lapping operation removes a predetermined thickness of wafer material, such as about 40 to 120 microns, and preferably about 75–85 microns is removed by the lapping operation. The lapping apparatus removes material from the wafer at a rate preferably between 3 and 20 microns per minute. The operation of the conventional lapping apparatus will be apparent to those skilled in the art and therefore will not be further described.

Once the lapping operation is completed, the wafer is then cleaned and placed in a fine grinding apparatus (not shown) in which the front surface of the wafer is subjected to a fine grinding operation to reduce the damage on the front surface induced by the lapping step and to further reduce the thickness of the wafer. The damage on the back surface is left intact during the fine grinding operation. The fine grinding apparatus is preferably a conventional vertical spindle circumferential grinding apparatus. A suitable fine grinding apparatus is manufactured by Disco Corporation, Santa Clara, Calif., under the trade name DFG 840. This apparatus includes a pair of grinding wheels attached to respective motor driven spindles that rotate the grinding wheels and are capable of being moved up and down on a vertical axis. The wafer is drawn by vacuum against a chuck of a support table with one surface of the wafer lying against the chuck and the opposite surface facing one of the grinding wheels in opposed relationship.

As the grinding wheel is rotated by the motor driven spindle, the spindle is lowered along its vertical axis into contact with the wafer to grind down the surface of the wafer. The vertical axis of the spindle is offset from the center of the wafer so that only a peripheral portion of the grinding wheel contacts the wafer. While the grinding wheel is in contact with the wafer, the wafer rotates around its center to assure uniform grinding of the front surface of the wafer. The grinding wheels used in the grinding apparatus are preferably a cup-shaped, resin bonded diamond grinding wheel known to those skilled in the art as comprising a resin matrix impregnated with grains of suitable size and material for grinding silicon. The average size of the grains impregnated into the resin matrix of the grinding wheel are preferably in the range of 0.5 to 7 microns, and more preferably in the range of 3 to 5 microns.

The rate at which the grinding wheel is infed toward the wafer for grinding down the wafer thickness (otherwise referred to as the grinding speed) is in the range of about 1 to 35 microns per minute, and more preferably about 15 microns per minute. The fine grinding operation removes a small thickness from the wafer, preferably between 5–20 microns and more preferably about 10 microns. It is to be understood that a grinding apparatus having only a single spindle and grinding wheel may be used for the fine grinding operation without departing from the scope of the invention.

Preferably, the damage remaining on the back surface is not significantly reduced between the lapping step and the polishing step. After the fine grinding operation, particulate matter is removed from the front surface of the wafer, preferably by a conventional chemical etching operation well known to those in the art. This operation is not directed to removing damage from the back surface. A dilute etching solution is used so that the cleaning step removes no more than a small amount of wafer material. Typically, the etching operation will remove about 1 to 2 microns of wafer material.

The wafer is then subjected to a conventional double surface polishing operation (commonly referred to as "double-side polishing" or "DSP") in which both surfaces are polished simultaneously to improve the flatness of the wafer and to reduce wafer damage on the front and back surfaces. The wafer damage is reduced about the same on the front and back surfaces, but the wafer damage remaining on the back surface is greater than the wafer damage on the front surface. The wafer damage remaining on the back surface facilitates gettering on the back surface. The same apparatus may be used for both the lapping and the DSP steps, such as the AC1400 or the AC2000 machine described above. The DSP apparatus includes polishing pads mounted on rotating plates and an alkali colloidal silica slurry (polishing slurry) supplied to the pad-wafer interface. Suitable polishing pads include Model Nos. H-2 and Suba 600 manufactured by Rodel Corporation, Newark, Del. A suitable slurry is manufactured by E. I. du Pont de Nemours and Co. under the trade name SYTON. The DSP step preferably removes about 10–30 microns of wafer thickness. Preferably, the thickness is removed at a rate of about 0.5 to 3.5 microns per minute, more preferably about 0.5 to 2 microns per minute. The DSP step preferably removes nearly all the damage from the front surface, while leaving some amount of damage on the back surface for gettering sites. It will be apparent to those skilled in the art that the thickness necessarily removed in the DSP step will generally vary in relation with the amount of damage caused in the lapping step.

One type of measurement of the amount of damage on the back surface is a count of "oxidation induced stacking faults" (OISF), which indicates the density of damage sites on the wafer surface. Generally, a relatively high OISF count is preferred on the back surface for facilitating gettering. In this invention, the OISF count for the back surface is increased by using a larger grain lapping abrasive, such as about 15 micron alumina grains, and by removing a relatively small amount of wafer thickness in the DSP step, such as about 6 microns. This relationship will be apparent from the examples discussed below. A satisfactory OISF count on a back surface for a typical application would be between about 10,000 and 40,000 counts per square centimeter, but the desired number will vary greatly depending upon the application and customer requirements.

The DSP step flattens the wafer to a flatness that is not attainable in single surface polishing processes. Wafers can be characterized for flatness in terms of a global flatness variation parameter (for example, total thickness variation ("TTV") or in terms of a local site flatness variation parameter (for example, Site Total Indicated Reading ("STIR")). TTV, frequently used to measure global flatness variation, is the difference between the maximum and minimum thicknesses of the wafer. STIR, frequently used to measure local site flatness variation, is the sum of the maximum positive and negative deviations of the surface in a small area of the wafer from a reference plane which is parallel to the back surface of the wafer and intersects the front surface at the center of the local site. A more detailed discussion of the characterization of wafer flatness can be found in F. Shimura, *Semiconductor Silicon Crystal Technology* (Academic Press 1989), pp. 191–195. For example, a conventional polished semiconductor wafer typically will have a TTV exceeding about 1.0 $\mu$m and a STIR (back reference center focus) exceeding about 0.25 $\mu$m for any 25 mm×20 mm site. The mean TTV and STIR of the wafers after the DSP step in the present invention is significantly lower.

After the DSP step, the front surface is finish polished using a conventional polishing apparatus. The finish polishing step substantially eliminates the damage in the front surface and thus reduces nonspecularly reflected light from the front surface. Typically, about 0.1 to 3 microns of wafer thickness is removed in the front surface polishing step, depending on the depth of scratches remaining after the DSP step. However, excessive material removed in the finish polishing step has been found to degrade the flatness of the wafer. It is within the scope of this invention to omit the front surface finish polishing step.

EXAMPLE

Fifteen silicon semiconductor wafers, each having a diameter of 200 mm, were processed according to the method illustrated in FIG. 1 and described above as the first embodiment. The lapping operation was performed to remove approximately 80 microns (40 microns on each of the front and back surfaces) of material from each wafer using 15 $\mu$m grain lapping slurry. The front surface of each wafer was then subjected to the fine grinding operation to remove an additional 15–17 microns of thickness from the wafer. Each wafer was then subjected to the DSP operation, in which about 5–6 microns were removed from the wafers, an approximately equal amount being removed from the front and back surfaces. The OISF count of the back surface of one wafer was measured at 20,000 per square centimeter after the DSP operation.

SECOND EMBODIMENT

Figure 2:
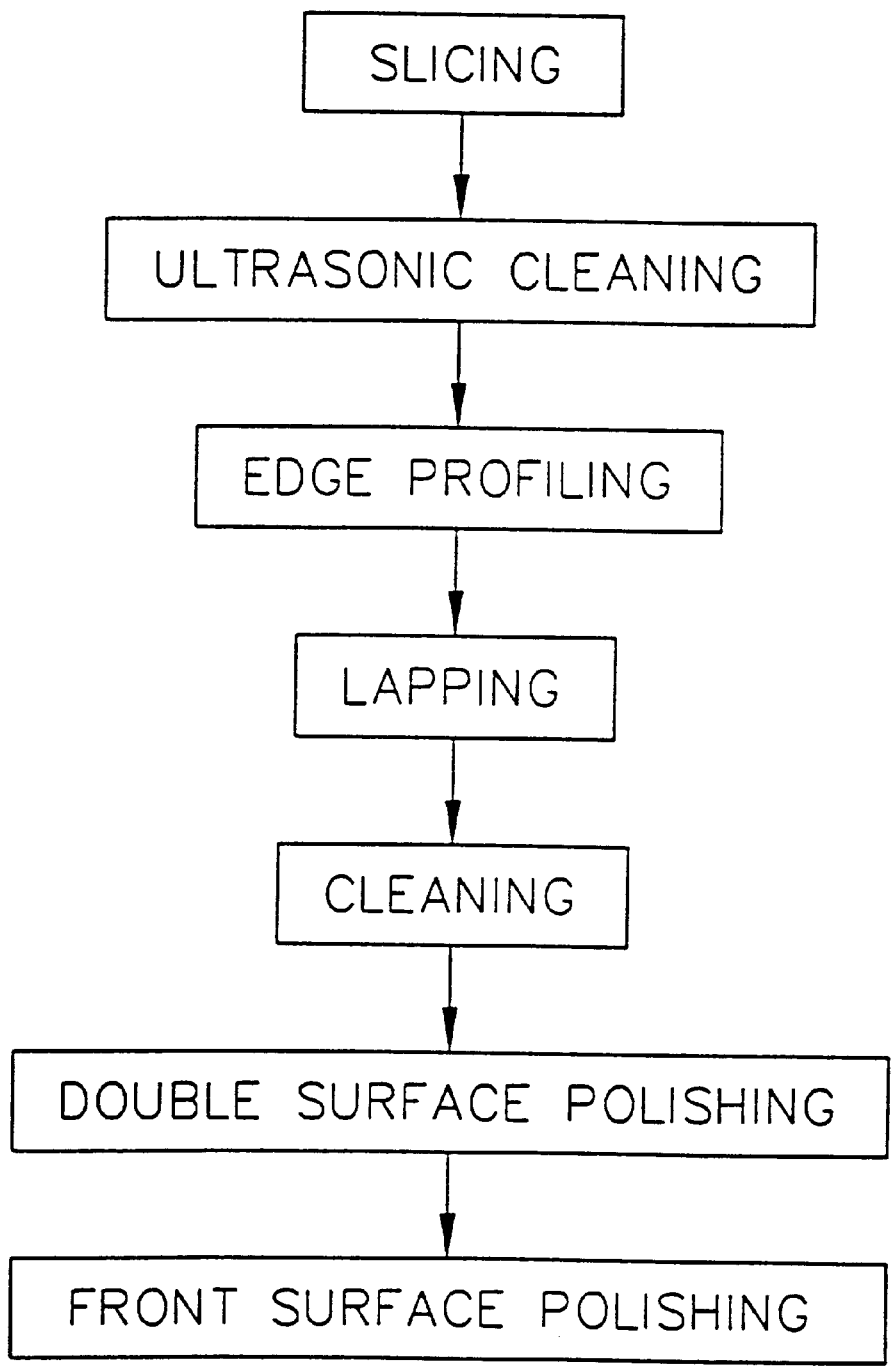
FIG. 2 is a flow diagram of a method of a second embodiment.

In a second embodiment of this invention shown in FIG. 2, the fine grinding step is omitted. In this second embodiment, slicing, ultrasonic cleaning, edge profiling and lapping are performed as described in the first embodiment, except that the abrasive used in the lapping apparatus is preferably between about 5–10 microns. The smaller size is preferred because it produces less damage on the surfaces, thus reducing the amount of wafer material that must be removed in the DSP step. The wafer is then cleaned and then subjected to a DSP step similar to the step described in the first embodiment except that more material is removed from the front surface than the back surface.

The DSP step of the second embodiment preferably removes nearly all the damage from the front surface, while leaving some amount of damage on the back surface. The damage sites on the back surface facilitate gettering on the back surface. The DSP apparatus can be set to remove a significantly different amount of material from the front surface than the back surface. This "differential removal" can be accomplished, for instance, by increasing the temperature of the upper polishing pad in contact with the front surface relative to the temperature of the lower polishing pad in contact with the back surface. The temperature of each polishing pad is controlled by circulating water which is in thermal communication with the respective plates in contact with the pads. The AC1400 and AC2000 model polishers include a control system for controlling the temperature of the circulating water in communication with the upper plate and a separate control system for the circulating water in communication with the lower plate. The separate systems enable the user to increase the temperature of the upper polishing pad with respect to that of the lower polishing pad and thereby remove more material from the front surface than the back surface. Alternatively, the differential removal can be accomplished by controlling the rotational velocity of the polishing pads. The effective velocity of the wafers against each polishing pad may be varied so that, for instance, the lower polishing pad moves in the same direction and at nearly the same velocity as the wafer while the upper polishing pad moves in the opposite direction of the wafer. This will cause greater material removal from the front surface than the back surface.

Steps subsequent to the DSP step are performed in the same manner as in the first embodiment. Preferably, none of the damage on the back surface is removed between the lapping and DSP steps. More preferably, no processing is performed on the back surface between the lapping and DSP steps other than cleaning the back surface.

As described herein, the method of the present invention processes the wafer up to and including the finish polishing operation, at which point the wafer is cleaned, packaged and delivered to a customer.

In view of the above, it will be seen that the several objects of the invention are achieved and other advantageous results attained. The present invention is significantly more efficient in producing a relatively flat wafer having back side damage for gettering sites. The invention eliminates the conventional processing step necessary to create damage on the back surface. Damage that is conventionally created on both surfaces during lapping is preserved on the back surface during processing. The invention reduces processing time because it eliminates the need to protect the front surface when the back surface is processed. Moreover, the invention produces a relatively flat wafer because no back side damage step (which degrades flatness) is performed after double side polishing. Damage is "built in" to the back surface of the wafer because more damage is removed from the front surface than the back surface before the DSP step. Thus, the conventional processing step is eliminated and the wafer produced is relatively flat.

When introducing elements of the present invention or the preferred embodiments) thereof, the articles "a", "an", "the" and "said" are intended to mean that there are one or more of the elements. The terms "comprising", "including" and "having" are intended to be inclusive and mean that there may be additional elements other than the listed elements.

While the invention is susceptible to various modifications and alternative forms, specific embodiments thereof have been shown by way of example and were herein described in detail. It should be understood, however, that it is not intended to limit the invention to the particular form disclosed, but on the contrary, the intention is to cover all modifications, equivalents and alternatives falling within the spirit and scope of the invention as defined by the appended claims.

What is claimed is:

1. A method of processing a semiconductor wafer sliced from a single-crystal ingot and having front and back surfaces and a peripheral edge comprising the steps, in order, of:
   (a) lapping the front and back surfaces of the wafer to reduce the thickness of the wafer and to improve the flatness of the wafer, the lapping step creating damage on the front and back surfaces;
   (b) fine grinding the front surface of the wafer to reduce the damage on the front surface remaining after the lapping step, the damage on the back surface being left intact; and
   (c) simultaneously polishing the front and back surfaces of the wafer using a polishing slurry to improve the flatness of the wafer and to reduce wafer damage on the front and back surfaces, the wafer damage remaining on the back surface being greater than the wafer damage on the front surface, the wafer damage remaining on the back surface facilitating gettering.

2. The method set forth in claim 1 wherein the processing of the wafer from lapping up to and including polishing is free of any step performed on the back surface which is not also performed on the front surface.

3. The method set forth in claim 2 wherein the damage on the back surface of the wafer is not substantially reduced between said lapping step and said polishing step.

4. The method set forth in claim 2 further comprising the step of finish polishing the front surface of the wafer to reduce nonspecularly reflected light.

5. The method set forth in claim 4 wherein the finish polishing step reduces the wafer thickness by about 0.1–3 microns.

6. The method set forth in claim 1 wherein the fine grinding step is conducted by placing the wafer in a grinding apparatus, the apparatus including a diamond abrasive wheel with a resin bonded matrix having grains sized in the range of 0.5–7 microns.

7. The method set forth in claim 6 wherein the grinding apparatus employs vertical spindle circumferential grinding for fine grinding the wafer.

8. The method set forth in claim 2 wherein the step of lapping is conducted at a material removal rate in the range of 3–20 microns per minute.

9. The method set forth in claim 8 wherein lapping slurry used in the lapping step includes alumina abrasive material having grains sized in the range of 5–30 microns.

10. The method set forth in claim 9 wherein the lapping step reduces the wafer thickness by about 40–120 microns, the grinding step further reduces the wafer thickness by about 5–20 microns and the simultaneous polishing step further reduces the wafer thickness by about 10–30 microns.

11. The method set forth in claim 10 wherein the lapping step reduces the wafer thickness by about 75–85 microns and the grinding step further reduces the wafer thickness by about 10 microns.

12. The method set forth in claim 2 further comprising the step of cleaning the wafer with a dilute chemical etchant to remove particulate material from the wafer caused by fine grinding before polishing the front and back surfaces of the wafer.

13. The method set forth in claim 2 further comprising the step of grinding the peripheral edge of the wafer before the lapping step to reduce the risk of damage to the wafer during further processing.

14. A method of processing a semiconductor wafer sliced from a single-crystal ingot and having front and back surfaces and a peripheral edge comprising the steps, in order, of:
   (a) lapping the front and back surfaces of the wafer to reduce the thickness of the wafer and to improve the flatness of the wafer, the lapping step creating damage on the front and back surfaces; and
   (b) simultaneously polishing the front and back surfaces of the wafer such that less wafer material is removed from the back surface than the front surface by polishing the front surface at a higher temperature than the back surface, the wafer damage remaining on the back surface being greater than the wafer damage on the front surface, the wafer damage remaining on the back surface facilitating gettering.

15. The method set forth in claim 14 wherein the damage on the back surface of the wafer is not reduced between said lapping step and said polishing step.

* * * * *